United States Patent [19]

Eisfeller

[11] 4,407,871
[45] Oct. 4, 1983

[54] VACUUM METALLIZED DIELECTRIC SUBSTRATES AND METHOD OF MAKING SAME

[75] Inventor: Richard C. Eisfeller, Greenland, N.H.

[73] Assignee: Ex-Cell-O Corporation, Troy, Mich.

[21] Appl. No.: 309,783

[22] Filed: Oct. 8, 1981

Related U.S. Application Data

[63] Continuation-in-part of Ser. No. 133,857, Mar. 25, 1980, abandoned.

[51] Int. Cl.³ .................. B32B 3/10; B32B 3/18; B32B 5/16; C23C 13/02
[52] U.S. Cl. ........................... 428/31; 427/250; 427/294; 427/296; 428/142; 428/148; 428/201; 428/203; 428/208; 428/213
[58] Field of Search ............... 427/250, 294, 296, 404; 428/31, 201, 203, 204, 206, 208, 213, 215, 216, 328, 142, 148

[56] References Cited

U.S. PATENT DOCUMENTS

| | | | |
|---|---|---|---|
| 2,039,372 | 5/1936 | Wichmann | 428/148 |
| 2,096,170 | 10/1937 | Geisler et al. | 428/686 |
| 2,413,604 | 12/1946 | Colbert et al. | 427/50 |
| 2,413,606 | 12/1946 | Colbert et al. | 427/166 |
| 2,450,850 | 10/1948 | Colbert et al. | 427/166 |
| 2,450,851 | 10/1948 | Colbert et al. | 427/166 |
| 2,680,695 | 6/1954 | Judd | 427/164 |
| 2,724,663 | 11/1955 | Bond | 427/50 |
| 2,765,520 | 10/1956 | Donley | 428/642 |
| 2,776,598 | 1/1957 | Dreyer | 350/397 |
| 2,923,651 | 2/1960 | Petriello | 264/127 |
| 2,940,950 | 6/1960 | Gasman | 525/203 |
| 2,992,125 | 7/1961 | Fustier | 427/250 |
| 2,993,806 | 7/1961 | Fisher et al. | 427/404 |
| 3,025,181 | 3/1962 | Nuessle et al. | 428/248 |
| 3,048,496 | 8/1962 | Buechler et al. | 428/473 |
| 3,061,564 | 10/1962 | Zdanowski | 524/599 |
| 3,076,726 | 2/1963 | Ault | 428/447 |
| 3,076,727 | 2/1963 | Harwig | 428/432 |
| 3,084,073 | 4/1963 | Kine et al. | 428/196 |
| 3,085,913 | 4/1963 | Caswell | 427/250 |
| 3,086,284 | 4/1963 | Schetky | 428/608 |
| 3,118,781 | 1/1964 | Downing | 428/215 |
| 3,138,517 | 6/1964 | Charbonneau | 428/248 |
| 3,152,950 | 10/1964 | Palmquist et al. | 428/335 |
| 3,157,473 | 11/1964 | Acton | 428/626 |
| 3,201,271 | 8/1965 | Simmons, Jr. et al. | 428/416 |
| 3,223,554 | 12/1965 | Newman | 427/152 |
| 3,232,818 | 2/1966 | Loew et al. | 428/122 |
| 3,276,905 | 10/1966 | Porter, Jr. | 428/416 |
| 3,286,904 | 11/1966 | Vieth et al. | 229/4.5 |
| 3,380,156 | 4/1968 | Lood et al. | 29/620 |
| 3,400,014 | 9/1968 | Blumberg et al. | 427/404 |
| 3,415,672 | 12/1968 | Levinstein et al. | 427/250 |
| 3,425,071 | 2/1969 | Frieder et al. | 441/40 |
| 3,440,129 | 4/1969 | Anselm | 428/376 |
| 3,445,271 | 5/1969 | Jensen | 427/255.1 |
| 3,473,996 | 10/1969 | Whalen, Jr. | 428/339 |
| 3,476,593 | 11/1969 | Lehrer | 428/642 |
| 3,480,464 | 11/1969 | Lacy | 428/336 |
| 3,488,166 | 1/1970 | Kovac et al. | 428/551 |
| 3,493,257 | 2/1970 | Fitzgerald et al. | 293/71 |
| 3,505,098 | 4/1970 | Miller et al. | 204/38 A |
| 3,506,532 | 4/1970 | Bock et al. | 428/31 |
| 3,508,887 | 4/1970 | Chezel et al. | 428/680 |
| 3,515,579 | 6/1970 | Shephard et al. | 428/436 |
| 3,516,720 | 6/1970 | Mauer | 350/1 |
| 3,518,156 | 6/1970 | Windecker | 428/251 |
| 3,520,716 | 7/1970 | Okamoto et al. | 427/250 |
| 3,533,919 | 10/1970 | Prior | 204/38 |
| 3,537,855 | 11/1970 | Lubin et al. | 430/564 |
| 3,562,235 | 2/1971 | Ryan | 428/220 |
| 3,590,768 | 7/1971 | Shanok | 116/28 R |
| 3,617,348 | 11/1971 | Kelley et al. | 427/89 |
| 3,640,815 | 2/1972 | Schwartz et al. | 204/38 S |
| 3,677,792 | 7/1972 | Best | 427/248.1 |
| 3,681,180 | 8/1972 | Kent | 428/189 |
| 3,681,225 | 8/1972 | Genma et al. | 428/680 |
| 3,687,792 | 8/1972 | Ruff | 428/189 |
| 3,698,929 | 10/1972 | Diebold et al. | 427/383.1 |
| 3,700,485 | 10/1972 | Rubin | 427/251 |
| 3,720,567 | 3/1973 | Shanok et al. | 428/31 |
| 3,737,380 | 6/1973 | Bahmeier | 204/15 |
| 3,740,254 | 6/1973 | Lansbury et al. | 428/423.7 |
| 3,741,800 | 6/1973 | Baier et al. | 428/625 |
| 3,741,881 | 6/1973 | Abu-Isa et al. | 204/30 |
| 3,744,835 | 7/1973 | Carbone | 293/1 |
| 3,751,293 | 8/1973 | Theuerer et al. | 427/52 |
| 3,770,479 | 11/1973 | Dunning | 428/151 |
| 3,770,545 | 11/1973 | Jackson | 156/221 |
| 3,775,157 | 11/1973 | Fromson | 427/250 |
| 3,783,012 | 1/1974 | Morita et al. | 428/462 |

| | | | |
|---|---|---|---|
| 3,809,568 | 5/1974 | Askew | 428/209 |
| 3,813,258 | 5/1974 | Pieper et al. | 427/250 |
| 3,836,387 | 9/1974 | Roblin et al. | 427/250 |
| 3,838,304 | 9/1974 | McDonie | 313/94 |
| 3,839,129 | 10/1974 | Neumann | 428/61 |
| 3,843,475 | 10/1974 | Kent | 428/35 |
| 3,847,650 | 11/1974 | Gregory et al. | 427/250 |
| 3,873,347 | 4/1975 | Walker et al. | 427/250 |
| 3,874,901 | 4/1975 | Rairden, III | 427/250 |
| 3,911,178 | 10/1975 | McDowell et al. | 428/31 |
| 3,914,472 | 10/1975 | Nakanishi et al. | 427/250 |
| 3,915,809 | 10/1975 | Wheatley | 204/15 |
| 3,922,400 | 11/1975 | Kawanoke et al. | 427/265 |
| 3,933,938 | 1/1976 | Rhodes, Jr. et al. | 428/31 |
| 3,934,059 | 1/1976 | Polinsky | 427/90 |
| 3,936,545 | 2/1976 | Brill et al. | 427/343 |
| 3,949,139 | 4/1976 | Dunning et al. | 428/328 |
| 3,978,252 | 8/1976 | Lombardo et al. | 427/299 |
| 3,987,127 | 10/1976 | Dickie et al. | 525/287 |
| 3,987,217 | 10/1976 | Greeson et al. | 427/90 |
| 3,998,603 | 12/1976 | Rairden, III | 428/651 |
| 4,008,084 | 2/1977 | Ikeda et al. | 427/255.6 |
| 4,035,526 | 7/1977 | Konantz et al. | 427/90 |
| 4,048,349 | 9/1977 | White et al. | 427/250 |
| 4,112,190 | 9/1978 | Sato et al. | 427/250 |

FOREIGN PATENT DOCUMENTS

| | | |
|---|---|---|
| 39268/78 | 2/1980 | Australia . |
| 37497/78 | 7/1981 | Australia . |

OTHER PUBLICATIONS

J. F. Pocza, A. Barna and P. B. Barna, "Formation Processes of Vacuum-Deposited Indium Films and Thermodynamical Properties of Submicroscopic Particles Observed by In Situ Electron Microscopy", *Journal of Vacuum Science and Technology*, vol. 6, No. 4, Jul./Aug. 1969, pp. 472-475.

Maisel, Leon I. and Reinhard Gland, Eds., *Handbook of Thin Film Technology*, McGraw Hill, New York, 1970, pp. 8-26 to 8-37.

Murakami, Yoshio, "Sticking Coefficients of Gold Atoms in the Nucleation and Growth Process of Gold Deposits on Polyfluoroethylene-propylene", *Japanese Journal of Applied Physics*, vol. 10, No. 1, Jan. 1971, pp. 63-71.

Murr, Lawrence E., "Effect of Electric and Magnetic Fields, Substrate Temperature, Pressure, and Evaporation Rate on the Nucleation, Structure, and Residual Properties of Vapor Deposited Metal Films", USCEE Report 339, USC-113P22-2, Annual Progress Report No. 2, Department of Materials Science, University of Southern California, Period Apr. 1, 1969 to Mar. 31, 1971.

Port, C. Otis, "Restoring the Luster to Metallized Markets", *Modern Plastics*, Dec. 1974, pp. 42-46.

Hale, G. J., G. W. White and D. E. Meyer, "Ion Plating Using a Pure Ion Source: An Answer Looking for Problems", *Electronic Packaging and Production*, May 1975, pp. 39-45.

Thornton, John A., "Influence of Substrate Temperature and Deposition Rate on Structure of Thick Sputtered Cu Coatings", *J. Vac Sci. Technol.*, vol. 12, No. 4, Jul./Aug. 1975, pp. 830-835.

Pal, Arun K. and S. Chaudhuri, "Effect of Grain--Boundary Scattering on the Electrical Resistivity of Indium Films", *Journal of Materials Science*, vol. 11, 1976, pp. 872-876.

Eickelberg, Frederick, "Continuous Vacuum Metallizing", *Modern Plastics*, Dec. 1977, pp. 42-45.

Halliday, David and Robert Resnick, "Interference from Thin Films," *Physics*, John Wiley & Sons, N.Y., 1978, pp. 1006-1011.

Sorg, Richard T., "Automotive Exterior Vacuum Metallizing—Past, Present, Future", Society of Vacuum Coaters (SVC) Tech. Conf., 1978, pp. 66-68.

Norman, Michael K., "Vacuum Metallized Auto Exteriors-Past, Present, and Future," SAE, Jun. 7, 1978, 10 pp.

Chopra, Kasturi, L., *Thin Film Phenomena*, Robert Krieger Publishing Co., Huntington, N.Y., 1979, pp. 159-171.

Schrantz, Joe, "Sputtering in Production at Chevrolet", *Industrial Finishing*, Oct. 1979, pp. 33-35.

Lindsay, D. M., "Alternatives to Conventional Chrome Plated Plastics," SVC Annual Conference, 1979, pp. 24-31.

Smith, Hugh R., Jr., "A Critique on Current Deposition Techniques", SVC Annual Conference, 1979, pp. 58-61.

Kovacs, G. J. and P. S. Vincett, "Summary Abstract: Formation of Novel Vacuum Evaporated Submicron Particulate Monolayers Just Beneath a Heated Polymer Surface", *J. Vac. Sci. Technol.*, vol. 20, No. 3, Mar. 1982, pp. 419-420.

Springborn Laboratories, Inc., "Future of Metallic Finishes for Plastics", Apr. 1982, pp. 10, 20 and 92.
Craighhead, H. G., R. E. Howard, J. E. Sweeney and D. M. Tennant, "Textured Surfaces: Optical Storage and Other Applications", *J. Vac. Sci. Technol.*, vol. 20, No. 3, Mar. 1982, pp. 316-319.
"First Surface Mirrors and Beam Splitters", from *Evaporated Metal Films*, Evaporated Metal Films Corp., Ithaca, NY, (1959), 7 pp.
Weast, Robert C., *Handbook of Chemistry and Physics*, 51st Ed., The Chemical Rubber Co., 1970, p. E204.
Bozorth, Richard M., *Ferromagnetism*, D. Van Nostrand Company, Inc., New York, 1951, pp. 146-148.
"Metals Handbook", 8th Edition, vol. 2, ASM Handbook Committee, American Society for Metals, Metals Park, Ohio, 1964, pp. 517 and 518.

*Primary Examiner*—William J. Van Balen
*Attorney, Agent, or Firm*—John C. Evans

[57] ABSTRACT

A surprisingly corrosion and abuse resistant plastic object vacuum-metallized with a corrosion prone metal, on a dielectric substrate consists of minute specular electrically-discrete "islands" of the metal topcoated with a clear resinous layer which encapsulates and insulates the islands, one from another. The metal islands are less than one thousand angstroms thick and have an average diameter of less than three thousand angstroms. This island structure is secured by stopping the growth of the metal as it is deposited between the nucleation stage and the stage of channelization or formation of an electrically conductive film. The island structure permits the dielectric resinous topcoat to penetrate in, about and under the metal islands encapsulating and securely bonding them to the substrate.

A preferred application of this invention is the manufacture of exterior automobile trim components the base structure of which is a flexible elastomer such as a thermoplastic urethane and which have the appearance of electrodeposited chrome parts.

16 Claims, 5 Drawing Figures

VACUUM METALLIZED DIELECTRIC SUBSTRATES AND METHOD OF MAKING SAME

RELATED APPLICATION

This application is a continuation-in-part of application Ser. No. 133,857, "Vacuum Metallized Articles" filed Mar. 25, 1980 by the present inventor, now abandoned, the description of which is incorporated by reference.

PRIOR ART

Vacuum metallizing of plastic and similar dielectric substrates has been practiced for some time, see U.S. Pat. Nos. 2,992,125—Fustier, 2,993,806—Fisher, 3,118,781—Downing 3,914,472—Nakanishi 4,101,698—Dunning, 4,131,530—Blum, 4,211,822—Kaufman, and 4,215,170—Oliva.

The automobile industry has had a desideratum for metallized trim components that could be substituted for conventional chrome-plated metal parts. See "Restoring the Luster to Metallized Markets", *Modern Plastics,* December, 1974, page 42, et seq. However, weather, abuse and corrosion resistance of such metallized plastic parts has been marginal and their color match with electroplated chrome has been poor.

Work has been done in other fields with the vacuum depositing of indium, e.g. see Japanese Pat. No. 15812/78 by Nobuyoshi Fujihashi and Hiroo Miyamoto. Work has also been reported on the effect of vacuum metallizing conditions on the deposited metal grain structure. See "Influence of Substrate Temperature and Deposition Rate on Structure of Thick Sputtered Cu Coatings" by John A. Thornton, *J. Vac. Sci. Technol.,* Vol. 12, No. 4, July/August 1975, page 830, et seq.

Recently some commercial products have been made. See "Sputtering in Production at Chevrolet", Industrial Finishing, October, 1979, describing the Camaro Berlinetta grilles coated with a chrome alloy; "Alternatives to conventional Chrome Plated Plastics" by D. M. Lindsey of the General Motors Chevrolet Engineering Center; and a "Critique on Current Preparation Techniques" by Hugh R. Smith, Jr. of Industrial Vacuum Engineering, the latter two papers having been presented at the 1979 Society of Vacuum Coaters Annual Conference; "Ion Plating Using a Pure Ion Source: An Answer Looking for Problems", by Hale et al, Electronics Packaging and Production, May 1975, pg. 39 et seq; and "Continuous Vacuum Metallizing", Modern Plastics, December, 1977, page 42 et seq. While these articles describe the supposed successful manufacture of exterior automobile trim components that can reasonably be expected to give the performance required in service, they all fail to give the slightest hint that the vacuum metallized products do not look or appear as they should—that they are in fact substantially darker appearing than electro-deposited chrome and thus do not have the bright sheeny chrome look and showroom sparkle that a purchaser of a new automobile expects and demands.

No reference has been found that relates metal film island structure and spacing to the appearance and performance of a commercial product, to the conductivity of the metal layer, to the corrosion resistance of the metal layer and/or to the adhesion of the top coat. Nor does the prior art relate nucleation and film growth to a desired island structure and spacing that achieve these ends.

With regard to the last statement, two excellent reference books are:

*Thin Film Phenomena,* Kasturi L. Chopra, Robert E. Kreiger Publishing Company, Huntington, N.Y. 1979. See especially pp. 163 et seq.

*Handbook of Thin Film Technology,* Leon I. Maissel and Reinhard Glang, McGraw-Hill Book Company, New York, N.Y. 1970. See especially pp 8-32 et seq.

These texts discuss and illustrate the stages of metal film growth by vacuum deposition from metal nucleation and nuclei growth, to liquid coalescence, to electrically discrete islands, channelization with incipient film conductivity and finally full continuous film formation. Film formation of vacuum deposited metals on plastic substrates for commercial products, especially on elastomeric plastic substrates, is not discussed. Nor is the interdependence of the natures of the metal film and the top coating correlated with product performance.

None of the references show an awareness of the significant difference in performance to be obtained with a vacuum metallized flexible plastic product, top coated, where the metal particles are coalesced only to the island state instead of being allowed to coalesce to beyond the channellization stage where film conductivity is established. A careful reading of the patent literature will show that while a patentee may speak of the metal film being in particle form, these particles have resulted from the breaking up of a conductive coalesced continuous film by application of a solvent-containing top coating with the solvent attacking and causing swelling of the plastic base and consequent cracking and crazing. This cracking and crazing effect in most instances is quite striking, occurring within a few seconds of the application of the liquid top coat. The "islands" or particles formed by top coating of an electrically conductive metal film, while they may be electrically discrete after the top coat has been heat treated, are usually planar and have generally linear and angular corners as compared to the rounded, coalesced islands of the present inventions. In the present invention, the separate islands have coalesced from separate nucleation points, are globular or rounded and fused appearing and are part of the nucleation and growth process. The islands formed by cracking are substantially larger on the average. They might better be termed "platelets" and can be likened to the cracked surface of a dried mud puddle, which cracks are usually visible to the naked eye and detract from the appearance.

In general, the coalesced islands forming the indium films of the present invention are smaller and there is a much greater spacing between them that can be filled with the resin of the top coating, in effect encapsulating the islands and binding them to the substrate surface. The rounded islands are better protected by the resin and the film over all is far more corrosion resistant, surprisingly so. The metal film is much more securely adhered to the substrate—a very significant advantage. The appearance of the globular island product is better—it is more specular, more reflective.

The construction of the metal island structure on an organic substrated and top coated with a resinous film gives a new product not heretofore known. From the literature it appears that others in depositing metals by vacuum evaporation allowed the films to become conductive, i.e. grow beyond the island stage, at a point where their light transmission is too high to be useful, at least for the purposes of this invention.

In U.S. Pat. No. 3,118,781, while the patentee refers to the "particles of the vapor-deposited metal layer" (Col. 4) in the same breath he says the applied top coat "will penetrate into minute or microscopic cracks or spaces" between them (emphasis added). This patentee vacuum deposits gold, an inherently corrosion-resistant metal, which by the time it is of a thickness to give sufficient reflectivity of visible light (4,000-7,000° A) to be of interest, forms an electrically continuous and conductive layer. Following application of his top coating, (Col. 5, line 32 et seq) the patentee secured an increase in light transmission, which is consistent with crazing or cracking of a continuous metal film having occurred during application of the top coat. The patentee uses an "ultra thin" top coat because of the cohesion of the thin coating is not great as its adhesion to the metal. His tape tests show that the resin does not flow about and encapsulate his metal particles and bond well to the substrate under the platelets particles. Such an ultra-thin coating offers no physical protection to the metal film. In the present invention a top coat at least ½ mil thick is applied to impart good abrasion resistance besides effecting the requisite encapsulation.

U.S. Pat. No. 4,215,170 speaks of "an extremely thin coat of metallic particles deposited on a finely finished transfer agent." (Col. 2 lines 11-12) Those skilled in the art will appreciate that "particles" are not, cannot, be deposited from the vapor phase, Subsequently (Col. 4, line 23) the patentee refers to the "interstices or spaces between the metallic particles" following application of the top coat. Considering the metals (aluminum) and substrates (polypropylene) employed and the metal film thickness (105° A), it is obvious that his particles resulted from crazing of a continuous metal film. An aluminum film deposited to that thickness is electrically conductive until top coated. To secure the discrete coalesced islands of this invention from spaced nucleation points, it is necessary that the melting point of the metal be low enough, and the temperature of the receiving surface be high enough to effect the desired liquid coalescence of the metal. This could not happen in U.S. Pat. No. 4,215,170.

U.S. Pat. No. 4,101,698 says that a metal layer "is applied to the elastomeric film as a separate, discontinuous or captured, (sic) generally planar, reflective segments, preferably being applied in individual microscopic dots by vacuum-deposition." (Col. 2, line 29 et seq.). As discussed in the textbook references, the "planar" stage of particle shape is reached only after there has been sufficient coalescence for film formation. While this patentee may have thought that his "segments" were a result of the vacuum deposition, this was not the case—it was the result of the fracturing of a continuous film by application of the top coat.

The fundamental fault with U.S. Pat. No. 4,101,698 is that this patentee does not describe a means or apparatus for securing the "microscopic dots" he desired to have by vacuum deposition. At Col. 6 line 67 et seq., the patentee says the metal is vacuum deposited "in discontinuous quantities, or separate planar reflective segments such as dots". Did he use a screen or a grid of some type interposed between the source and the substrate? The size of the "dots" is not specified and in all probability they are ten to one hundred-fold times larger than the coalesced islands here of concern. In the present invention, the metal is not "applied" as "microscopic dots" by "vacuum-deposition" (which is impossible) but are formed into "dots" or coalesced islands during the metallization.

Neither U.S. Pat. No. 4,101,698 nor any other reference makes mention of the highly improved corrosion resistance that can be secured via the placing of the metal in the coalesced island form. In fact, U.S. Pat. No. 4,101,698 states in Col. 2 that he prefers to use corrosion resistant metals with the preferred metal being chromium. Chromium cannot be formed into the coalesced islands of the present invention on the substrate and under the conditions disclosed in U.S. Pat. No. 4,101,698.

U.S. Pat. No. 4,211,822 deposits indium on a plastic substrate. Careful reading of this patent establishes that the patentee carried the deposition of the indium through the coalescence stage to the point where channelization has occurred such that there is an interconnecting network of conductive paths and the metal film overall appears to be conductive. The corrosion resistance of this metal film because it is conductive overall would be terrible even if a relatively good insulating topcoat were placed over the metal film. This patentee obviously had no appreciation of the advantage of limiting the growth of the metal nuclei to the coalesced island stage such that there could be no innerconnecting electrically conductive pathways between the coalesced islands and the particles would be "free-floating" as desired in U.S. Pat. No. 4,101,698 and in the present invention. It is believed that the theory of the patentee in U.S. Pat. No. 4,211,882, Col. 2, line 17 et seq. is an erroneous theory as it is not the supposed melting/ductility of the metal that is permitting its formability as described by the patentee. Instead the coalescence of the metal has been carried to a reticulate structure which accepts flexing and stretching of the plastic undercoat without loss of the conductive electrical pathways.

The prior art has (1) not appreciated the possibility of vacuum depositing a metal on an organic surface (which surface is "impure" and causes a high nucleation rate) and arresting the film growth before the channelization/conductive stage of file formation is reached, using a metal and conditions to achieve a sufficient reflectivity to be of commercial interest, or (2) relating the resulting island structure to a desired product performance.

PRESENT INVENTION

The present invention is an article of manufacture comprising an organic dielectric base or substrate having a smooth surface such as a molded plastic, a macroscopically continuous-appearing very thin layer thereon of a vacuum deposited corrosion-prone metal. The metal is in the form of minute specular electrically discrete rounded metal islands. There is a topcoating over the metal film of an intimately adhered clear dielectric resinous film encapsulating and protecting the metal particles, and binding them firmly to the substrate.

This product is particularly useful in the automotive applications as an automobile exterior trim component to replace heavier and more expensive conventional chrome-plated metal parts.

The present invention is based on the finding that with a thin vacuum metallized layer if the metal layer as it is being deposited or coalesced into electrically discrete islands and maintained electrically non-conductive, the metal layer is corrosion resistant if adequately topcoated even though the metal is one that is corrosion prone such as indium. The metal film is non-conductive as deposited because the metal nuclei initially deposited from the vapor phase are allowed to grow in molten phase only to a discrete island stage with the particles being electrically isolated from one another. The coating is kept quite thin and there is insufficient metal deposited to bring about a bridging or coalescence of the metal particles and formation of an electrically conductive film. For most metals, the metal layer should have a nominal thickness less than 1000° A, preferably less than 600° A. By "nominal thickness" is meant the thickness determined by the weight of metal deposited per unit area as if a continuous film. An interferometer gives about the same reading.

The metal film on the other hand must be thick enough to reflect sufficient light, i.e. it must be opaque enough, to make the coated article appear as a metal article. Desirably the film will pass less than 25% of the light incident thereon at an angle greater than 60°. With some metals, such as aluminum and silver it is impossible at a practical temperature, to vacuum deposit sufficient metal to give the desired opacity and reflectivity and not to deposit so much as secure film electrical conductivity, i.e. bridging between the metal islands. The nature and temperature of the substrate surface and the operating condition can be important in this regard. For most metals, the minimum useful nominal film thickness will be at least 150° A.

If the individual metal islands have a diameter that is a fraction of the wave length of light, say a diameter of less than 3500° A, preferably less than 3000° A on the average, the metal layer is quite bright and specular and not milky or whitish as occurs when the island size exceeds about 4000° A. The appearance of an indium layer deposited according to this invention and top coated approximates that of electroplated chrome.

While vacuum metallized commercial products have heretofore been made from metals that are inherently corrosion resistant such as chromium or stainless steel, such vacuum metallized films are electrically conductive, and dark and unsatisfactory appearing. They do not look like electrodeposited chrome.

The metal film can be deposited by thermal evaporization, sputtering, ion plating, induction heating, electron beam evaporization and like methods. See *Thin Film Technology*, by Berry et al. D. Van Nostrand Company, Inc. Princeton, N.J., 1968, Lib. of Cong. 68-25817. Better or more uniform coverage appears to be secured especially with three dimensional objects having corners, edges, or recesses if some atoms of an inert gas such as argon are present in the vacuum chamber in excess of those required for the evaporation. The vacuum deposition is preferably carried out at a vacuum of $5 \times 10^{-3}$ Torr or less.

When the spacing between the metal islands of the film is such as to have the metal film electrically non-conductive, improved adhesion of the protective plastic topcoat results. This adhesion can be measured for example by the Ford adhesion test, specification No. ESB-M2P-105 B, or the Chevrolet tape adhesion test, Specification No. CTZ VM003 AA. This improved adhesion appears to be related to the separation between the individual metal islands or width of the channels, i.e. to the distinctiveness of the islands, rather than to their diameter or size. The top coating in cross section appears to encapsulate the islands, extending around and under them to secure good wetting of and adhesion to the substrate surface.

A novel and important point of this invention is this feature of encapsulating the metal islands to "fix" the electrical non-conductivity of the metal film and thus to increase manifold the corrosion resistance of the film. If the integrity of the topcoat is broken and moisture enters it only causes oxidation of the metal islands contiguous to the break and the blight of the corrosion cannot travel along the plane of the film under the topcoat as it can with the usual vacuum metallized and coated objects made with corrosion prone metals such as aluminum or conductive indium.

The resinous topcoat also improves resistance to mechanical abuse. Clear moisture resistant acrylic, urethane, and like coatings applied as a latex and more preferably as a solvent solution are suitable. For critical applications the topcoat will be baked to assure that a good tough continuous film is produced. The plastic film appears to fill the interstices and voids between and around the individual metal islands and helps further isolate one from another.

This invention is most usefully applied to metals and alloys which are not inherently strongly corrosion resistant: zinc, tin, gallium, aluminum, cadmium, copper, nickel, cobalt or iron as opposed to stainless steel, gold, platinum, chromium, nichrome, palladium and rhodium. Some of the latter such as rhodium are prohibitively expensive. With some of these metals such as nickel, cobalt, chromium and copper it has not been demonstrated as yet that the metal can be made to yield to the desired rounded island structure on a plastic substrate at an operable substrate temperature. The metal should have a melting point in the range of 100° to 350° C., preferably 125° to 250°. The word "metal" as used in the claims includes metal alloys having these characteristics, as well as pure metals.

Any suitable dielectric, i.e. electrically insulating, material can be used to receive the vacuum deposited metal such as dry wood, glass, or a plastic. For the intended automobile trim component application a castable or moldable plastic is used, preferably an elastomer that is tough and abuse resistant with some flexibility such an injection molding grade thermoplastic polyurethane (TPU). Such organic surfaces are "impure" relative to the quite pure or clean surface used for the work reported in the texts, supra. Such impure surfaces vastly increase the amount of nucleation.

By "flexible elastomer" is meant a natural or synthetic thermoplastic or thermoset plastic or polymer having an extensibility of greater than approximately 30% as compared to "rigid" plastics which have an extensibility of less than 10%. Of course for many applications where the article will not be subjected to mechanical abuse or impact, rigid plastics are perfectly suitable such as for instrument cluster trim or grills. Examples of suitable rigid plastics are polyolefins such as a polypropylene, a polyacrylonitrile-butadiene-styrene and a polycarbonate.

The nature of the flexible substrate does not appreciably affect the performance of the applied coatings. The substrate cannot be so stiff or rigid that it will not serve its intended function as a flexible trim component nor can it be too flexible or elastomeric. The present coating system can be applied over such flexible substrates such as reaction injection molded urethane, thermoplastic olefins and urethanes, nylon, rubber and polycarbonates. A suitable primer may be necessary to smooth or gain adherence to the substrate. The present coating system can, of course, be applied and used with substantially more rigid substrates, but other methods of bright trimming such as electroplating might be more economical to use on film or hard surfaces.

The vacuum deposited metal layer "mirrors" the surface on which it is deposited, i.e. the surface smoothness or roughness shows up in the deposited metal layer. For bright specular parts it is preferred to have the surface on to which the metal layer is deposited to be smooth as possible. Flame or thermally reflowed urethanes are particularly useful in this regard. Often it is desirable to overcoat the base plastic with a clear or pigmented basecoat of some sort prior to the carrying out of the vacuum deposition step. Pigmented prime coats can be used to obtain an initial levelling of the base plastic surface following which a clear or pigmented base coat can be applied to give a mirror smooth surface. These layers can be heat treated or baked as required to develop their maximum properties. If a urethane or other light sensitive substrate is used, weatherability of the article may be improved by using a pigmented base coat that prevents light penetration to the plastic base. Light can pass through the metallized layer in amounts sufficient to have a degrading effect on the lower plastic layers.

Sputtering and thermal evaporation are preferred methods of laying down the metal layer although the use of ion plating, induction heating or electron beam evaporation methods are not precluded so long as they are operated and controlled to give the discrete electrical non-conductive island structure.

Following the deposition of the metal layer the clear plastic topcoat, preferably one resistant to moisture penetration, is applied. Generally the thickness of the topcoat will be at least ½ mil. (0.0005 inches) thick (dry basis) and usually will not exceed 0.005 inches thick. For flexible exterior automobile trim, the topcoat is necessarily elastomeric and if thermo-setting, it can be thoroughly baked, for example at 250° F. or so, to develop its maximum properties. The topcoat is formulated to adhere both to the metal as well as to the base plastic. Acrylics and urethanes are preferred.

It has been found that with the flat or planar particulate structure obtained by causing crazing or cracking of an already electrically conductive vacuum deposited metal film, the topcoat does not penetrate the particles and reach and wet the substrate surface well, resulting in noticeably poorer adhesion as well as poorer resistance to corrosion because of the close spacing of the particles. With the cracked films formed from a conductive metal film only in the order of 2% or so of the underlying surface is exposed through the cracks whereas because of the shape and size of the channels of the film structure of the invention on the order of 40% of the underlying surface is exposed. This helps to explain the better top coat adhesions obtained with this invention. While this difference in open areas seems large, one should appreciate that the channels in the structure of this invention are of a different shape and of a much smaller width, −200°–300° A, and the islands are much smaller relative to those of the planar islands and channels (3000°–5000° A wide) formed by the cracking of a once electrically conductive film. The channels' size and size of the islands of the nonconductive films of this invention are such relative to the wave length of light that the film is quite specular and appears to be continuous. In contrast the gross size of the channels and islands of a cracked structure distort the reflected light and often cause iridescence.

As the metal film of the present invention exists as discrete islands flexing or bending of the metal film will not result in the further macro cracking of the metal layer such that there is no objectionable change in its appearance when the plastic part is bent or stretched and the stress is released. No other type of metal layer is known that will not crack or craze under this degree of flexing, bending and stretching.

The invention will now be described by way of the following examples and with reference to the accompanying drawings.

DRAWINGS

FIG. 1 is a graph comparing the percent diffuse reflectance (the ordinate) of a metallized coating of this invention against comparative coatings at various wave lengths of visible light spectrum expressed in nanometers (the axis). Except for Example A, all the samples were topcoated.

FIG. 2 is a micro photograph taken with a scanning electron microscope (SEM) at 44,000 magnification of a conductive indium layer about 1200° A thick prepared by thermal evaporation. The view angle is 45° and the grains have an average grain diameter of about 4500° A. The coating while having an acceptable diffuse reflectivity before topcoating was quite milky, was definitely conductive and had poor corrosion resistance even when topcoated.

FIG. 3 is a similar micro photograph of a similarly prepared indium coating except that the average size of the islands is about 1800° A, a size considered acceptable, and about 250° A thick.

FIG. 4 is a view of the island structure of an indium film at 83000 magnification taken by transmission electron microscopy (TEM). The resolution by TEM is far better than the SEM for showing the island spacing or channel width.

FIG. 5 is microphotograph for comparative purposes of a top coated aluminum layer deposited to such a thickness that it was initially electrically conductive.

EXPLANATION OF DRAWINGS

These data were obtained using a Thermal evaporator made by Consolidated Vacuum Corporation, Rochester, N.Y. Unless otherwise described, flat placques were prepared for testing. The reflectances were obtained with an Integrated Sphere Spectrophotometer, KCS-18 with specular component included, Model ACS-500S, made by Applied Color Systems, Inc., U.S. Highway 1, Princeton, N.J. Diffuse illumination by an 18" diameter sphere by a standard broad band light source was used according to the manufacturer's instructions (47 pages). A barium sulfate surface has a diffuse reflectance of 100% on this scale.

Line B is an example of this invention, being about a 220° A thick coating of indium with a clear topcoat, prepared as set out in the Example. It can be seen that the diffuse reflectance of the indium coating compares favorably with that of electro-deposited chrome. The indium without the topcoat has a higher reflectance than that of the chrome but the addition of the topcoat tones the reflectance down to what is shown.

Line C gives the reflectance of a sputtered chromium surface topcoated with the same topcoat as in B. It can be seen that sputtered chromium, which has a higher reflectance than chromium vacuum deposited by other techniques, is substantially darker than electrodeposited chromium.

Line D is the chrome alloy used for the Camaro Berlinetta TPU grill as described in the *Industrial Finishing* article, supra, the measurement having been obtained from the part itself. It can be seen that the appearance of the part is dark and unsatisfactory, which is why perhaps it is used in an unobtrusive location and manner.

Line E shows the least satisfactory metallized coating and yet this coating was touted by the Pennwalt Corporation, as being highly reflective—as having "solved" the problem of bright metal plastics finishing. See the "Continuous Vacuum Metallizing" article supra, page 45. These dates were obtained from a topcoated chromium alloy metallized sample, the metal of which was thermally evaporated by Pennwalt.

Well prepared topcoated sputtered stainless steel is slightly darker than Line C.

The minimum resistance at which the vacuum metallized layer becomes conductive and corrosion prone is difficult to establish. By the following procedure it was determined that a thin film of indium when deposited with sufficient thickness has a resistivity of less than 1 ohm which jumped to over 100 megaohms as the desposited metal film was made thinner down to about 80 millimicrons or 800° A. Intermediate resistivity values between these two could not be established. The test was carried out with a Megger brand insulation tester supplied by the Biddle Company of Plymouth Meeting, Pa. Test strips of the vacuum deposited indium were prepared on a dielectric plastic base. The strips were ½" wide×1½". A ½" section at each end was used for copper contact pads from the tester, leaving a ½" square center section as the test area. 500 volts were applied to the contact pads to obtain the indicated readings. By suitable calculation, it can be shown that the 100+ megaohm resistance value translated, when considering the thickness of the metal film, to a resistivity of 2.5 ohm cm.

Figure 3:
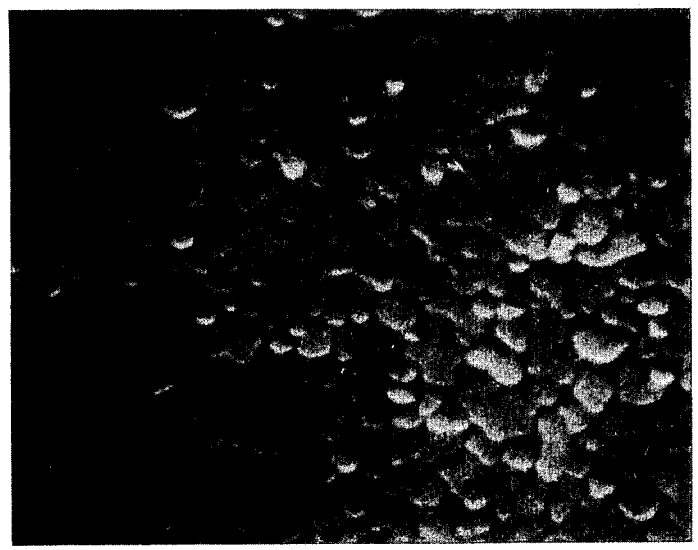

FIG. 3 shows the granular, island surface of an indium coating thermally evaporated onto a substrate plastic plaque having a composition as in Example I. The coating thickness was about 250° A and the average grain size was 1800° A. The diffuse reflectivity of the coating (without topcoat) was 74%. The coating was non-conductive by the above test and was corrosion resistant when topcoated.

A similar sample was prepared having an average particle size of about 3600° A. It had a reflectivity of 80% (not topcoated) but was hazy in appearance with a bluish cast. It was marginally non-conductive. The grains apparently had started to grow together.

Figure 1:
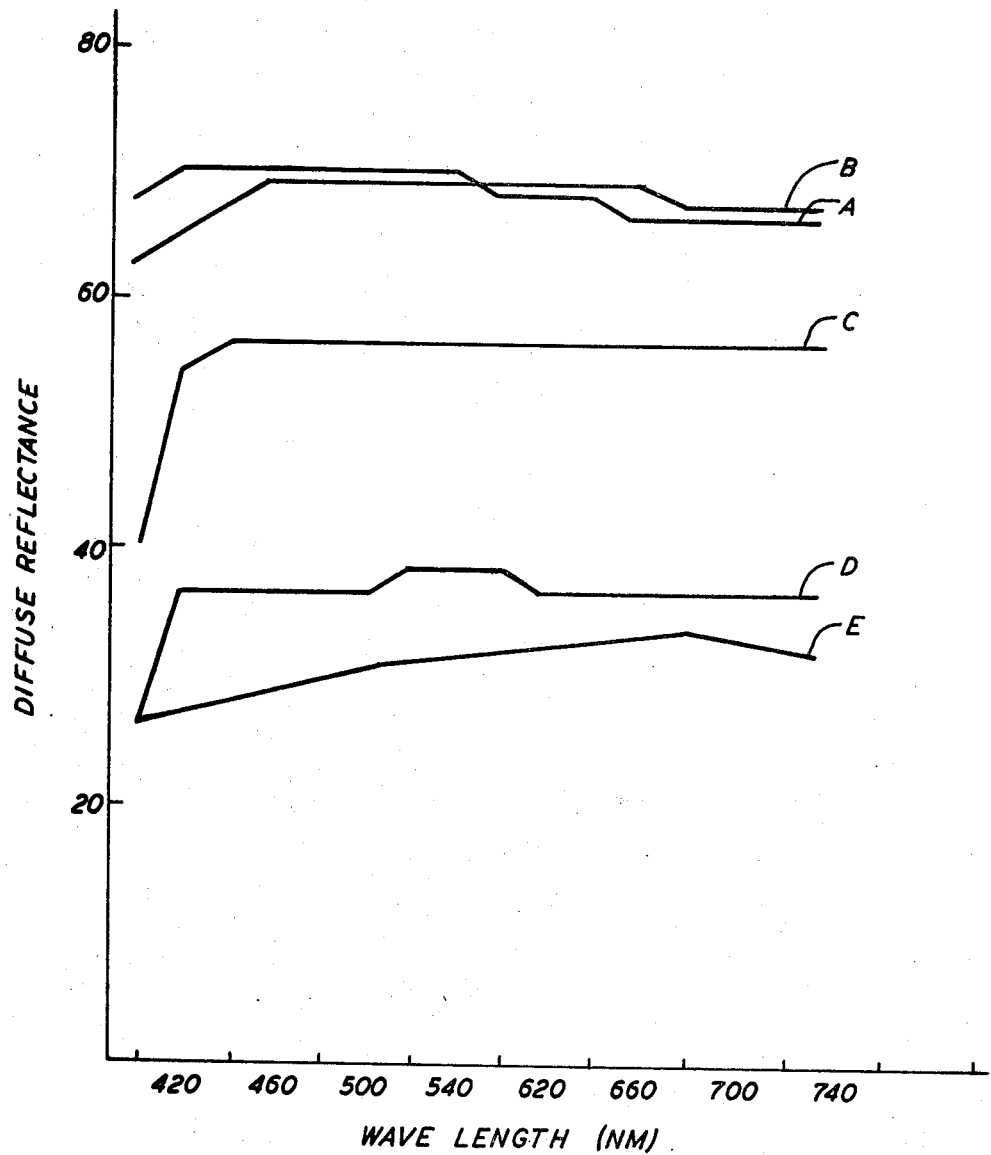
In FIG. 1, line A is a plot of the reflectance of conventional electroplated chromium surface, used as a standard goal or target.
Figure 2:

The coating of FIG. 2 was milky in appearance, had a reflectivity of 82% (not topcoated), and was conductive with a grain size of 4500° A which definitely exceeds acceptable limits.

Figure 4:

In FIG. 4 vacuum deposited indium film was microtomed to give slices that were 20 to 50 microns thick. These slices were encapsulated in an epoxy and were then microtomed or shaved to a tiny tip which contained the sample. The tip was then microtomed into approximately 1000° A thick specimens which were floated onto tiny copper grids. A diamond microtome was used to do this. Photographs were taken of the indium layer at 83000 magnifications and 283000 magnifications. FIG. 4 is a view of the island structure of the indium film at 83000 magnification.

Transmission electron microscopy can give images at very high magnifications with a resolution of less than 10° A. A very narrow beam of high voltage electrons (100 KV) is passed through the sample, magnified and projected onto a flourescent screen.

As can be seen from FIG. 4 the indium islands were eliptical and widely separated, which features could not be satisfactorily observed in the scanning electron microscope of a similar indium layer over the same base coat. The angle of the slice in FIG. 4 was about 60° to the plane of the metal and the sample was about 1200 to 1500° A thick, i.e. the picture is not a true 90° edge view of the indium layer. The island diameters between the TEM and SEM pictures are very similar, around 1800 to 2000° A. The small dots around the larger islands, resolved down to 30° A in diameter, were probably clusters of indium atoms about to coalesce with the larger islands.

The thickness of the indium layer was estimated from the TEM picture to be 450° A which is in fair agreement with the 390° A figure obtained by measuring the layer interferometrically.

FIG. 4 conveys how it is possible for the resinous topcoat to penetrate in and about the metal islands of the vacuum deposited metal film that has never been consolidated to the point of conductivity, encapsulating the islands and bonding them to the substrate surface. As previously explained the topcoat can penetrate the channels and in and about the particles, reaching the substrate surface to secure good wetting and consequently good bonding to that surface. This figure helps to explain the difference in results obtained with the vacuum metallized coatings of this invention and those obtained by fracturing or crazing vacuum deposited consolidated or electrically continuous metal films because of basecoat swelling and/or differences in thermal expansion/contraction between the topcoat, metal layer and base structure when heat treating to cure the topcoat.

Figure 5:
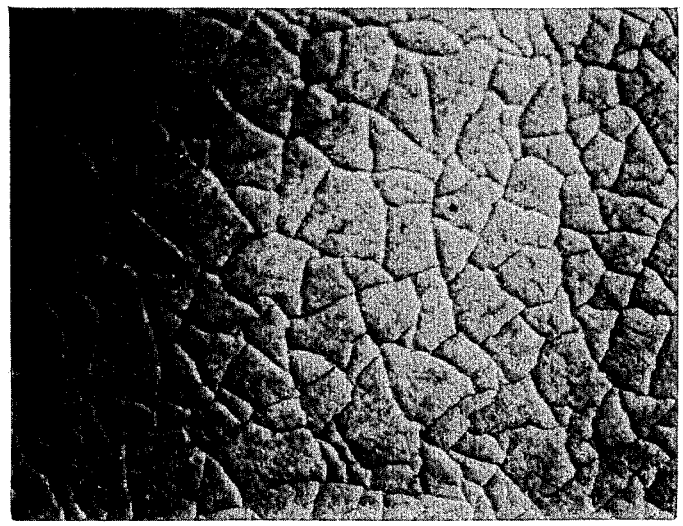

FIG. 5 is a microphotograph taken at 200X magnification with a Normarsky differential interference contrast objective of a thermally evaporated vacuum deposited layer of aluminum carried to the point where the metal layer was 240° A thick, continuous and electrically conductive. The base coat was the same as in the following Example 1. The sample was top coated with a top coat of an aliphatic urethane carried in a hexanediol adipate solvent, the same top coat as described in the following Example 1. The application of the top coat caused the cracking shown because of expansion of the base coat by absorption of the top coat solvent. The top coat was baked at 250° F. Note that the particles have a shape and spacing entirely different from those of the rounded islands of this invention. The island structure of this invention is substantially free of such platelet particles which have angular corners and linear edges that complement like corners and edges of adjacent platelets.

Several like samples were made using aluminum, chromium, a stainless steel and a combination of silver evaporated on a layer of stainless steel. All samples were thermally evaporated and deposited to a thickness where the metal films were electrically conductive and unbroken prior to top coating. They were applied to the urethane base coat of Example 1 and to an acrylic/urethane base coat, the top coat was thereafter applied and the samples baked at either 150°, 180° or 250°. All cracked in the manner shown in FIG. 5 yielding a definite, flat platelet structure.

Interestingly, gold and silver, which are not corrosion-prone metals, did not crack over this base coat upon application of the top coat and baking. They did wrinkle badly (iris). The explanation for this difference may be that the elongation of those metals, i.e., their unannealed maleabilities or ductilities, is much greater than those for indium, aluminum, chromium or the stainless steel.

EXAMPLES

Example 1

The sample part is a 1980 Cougar Chin Grille, Chevrolet Part No. XR7-234, injection molded with Goodrich 58130 thermoplastic urethane (TPU). A urethane enamel basecoat is applied over the grille. It is a standard production item supplied by PPG Industries, as ESP3967. This coating is a melamine modified blocked aliphatic urethane. This coating is light stable and is pigmented white to block light from reaching non-light stable substrates. The basecoat is thinned and sprayed according to manufacturer's instructions onto the properly cleaned surface at room temperature to a thickness of 1.0+ or −0.2 mils (dry basis). The applied coating requires an air flash of 20 minutes and is then baked for approximately 60 minutes at 250° F. to reach full properties.

After the grille is cooled to room temperature it is vacuum metallized with indium thermally evaporated at lower power from boats according to the following procedure:

A bell jar is pumped down to $5 \times 10^{-5}$ Torr and then backfilled with argon to $7 \times 10^{-4}$ Torr. The pumping system for the bell jar consists of a mechanical roughing pump, a silicone oil diffusion pump, and a liquid nitrogen coldtrap to minimize water vapor and outgassing in the bell jar. The function of the argon backfill is to obtain better coverage on three dimensional parts. 0.13 grams of high purity indium is flash evaporated from 0.010 mil thick tungsten boat ($4\frac{3}{4}''$ length, $\frac{1}{8}''$ dimple $\times 1\frac{1}{2}''$ long) connected in series to a 5 volt AC variable transformer. The grille is rotated on a carousel at 20 RPM with source to substrate distance varying during rotation from $8\frac{1}{2}''$ to $14\frac{1}{2}''$. This gives a metal thickness on the part of 425° A. Any suitable method of vacuum metalizing can be used.

The top coat is a solvent based aliphatic urethane prepared from 753 parts Union Carbide Hylene W, 506 parts Union Carbide PCP-0300 polycaprolactone polyol, 240 parts hexanediol adipate, and 23 parts Dow Corning DC-193 silicone. The topcoat is spray applied at 17% solids to a thickness of 1+ or −0.2 mils (dry basis). The coating is air flashed for 20 minutes and then baked for 60 minutes at 250° F. to reach full properties.

The completed composite gives the following performance against the Ford ESB-M2P105-B Elastomeric Exterior Paint Performance specification:

1. Color—very specular and an excellent color match to chrome plate.
2. Adhesion—Pass.
3. Flexibility—Pass.
4. Water Resistance—Pass
5. Weathering Resistance—Pass.
6. Thermal Shock Resistance—Pass.
7. Resistance to Water and Soap Spotting—Slight spotting.
8. Resistance to Acid Spotting—Pass
9. Gasoline Resistance—Pass.
10. Oil Resistance—Pass
11. Resistance to Scuffing—Pass.
12. Heat Resistance—Pass.
13. Chip Resistance—Acceptable, same as pigmented flexible exterior coatings.
14. Cold Flexibility—Pass.
15. Resistance to Galvanic Action—Pass.

In additon this composite passes the Ford Thermal Cycle-Corrosion Test from its Exterior Electroplating Specification ESB-M1P47-A.

Example 2

The sample part is a 1979 Ford Pinto Bezal, Part No. D7EB-16018-AWA, reaction injection molded from thermosetting urethane. The part is primed with PPG DEL-32906 gray urethane primer to give a smooth surface for basecoat application. Application is according to manufacturer's instructions and the primer is sprayed to a 1.0+ or −0.2 mil thickness. The bake for this coating is 10 minutes at 250° F. The basecoat, metal layer, and topcoat are the same as in Example No. 1.

Example 3

The part, basecoat, and metal layer are the same as in Example No. 1. The topcoat is Celanese 84-7609 urethane topcoat sprayed to a dry film thickness of 1.0+ or −0.2 mils. The coating is air flashed for 20 minutes and then baked one hour at 250° F. to reach full properties.

Example 4

The following table compares the light transmissions and thickness at which various metals deposited on various substrates by vacuum evaporation become electrically conductive and not useful in the present invention. It is to be noted that all of the metal films except that of indium became conductive at a light transmission far too high to be useful for the decorative usage purposes of this invention, i.e. for automobile bright trim. Also note that the indium film remained nonconductive and relatively opaque over a range of organic substrate types.

It is expected that vacuum sputtering and other methods of depositions will allow corrosion-prone metals other than indium to be placed in the desired electrical discrete rounded island form.

| TRANSMISSIONS AT WHICH METAL LAYERS DEPOSITED BY VACUUM EVAPORATION BECOMES CONDUCTIVE ON DIFFERENT SUBSTRATES (Thickness in °A; Light Transmission in %) | | | | | | | | | |
|---|---|---|---|---|---|---|---|---|---|
| | Urethane & Base Coat of Example 1 | | DuPont Mylar Type D500 (Metallizing Grade) | | Polyethylene (Not Metallizing Grade) | | Glass Microscope Slide | | Polypropylene (Exxon PP-12B) |
| In | 800°A | 7% | 1000°A | 1% | 1600°A | 2% | 1500°A | 2% | 1500°A | 1% |

-continued

TRANSMISSIONS AT WHICH METAL LAYERS DEPOSITED
BY VACUUM EVAPORATION BECOMES CONDUCTIVE ON
DIFFERENT SUBSTRATES
(Thickness in °A; Light Transmission in %)

| | Urethane & Base Coat of Example I | | DuPont Mylar Type D500 (Metallizing Grade) | | Polyethylene (Not Metallizing Grade) | | Glass Microscope Slide | | Polypropylene (Exxon PP-12B) | |
|---|---|---|---|---|---|---|---|---|---|---|
| Ag | 60°A | 63% | 45°A | 65% | 70°A | 55% | 70°A | 63% | 95°A | 61% |
| Al | 80°A | 75% | 90°A | 70% | 90°A | 70% | 80°A | 75% | 95°A | 55% |
| Au | 75°A | 70% | 40°A | 73% | 60°A | 60% | 40°A | 75% | 65°A | 63% |
| Cu | 75°A | 60% | 50°A | 70% | | | 50°A | 70% | 140°A | 65% |

The full names and addresses of companies mentioned supra are:

| Chevrolet | Chevrolet Motor Division Flint, Michigan |
| Goodrich | B. F. Goodrich Company 3135 Euclid Avenue Cleveland, Ohio 44115 |
| PPG Industries | PPG Industries 3800 W. 143rd Street Cleveland, Ohio |
| Union Carbide | Union Carbide Chemicals and Plastics South Charleston, W. Virginia 25303 |
| Celanese | Celanese Chemical Company, Inc. 1481 South 11th Street Louisville, Kentucky 40208 |
| Ford | Ford Motor Company Dearborn, Michigan |
| Exxon | Esso Chemical Co., 60 W. 49th Street New York, New York 10020 |

What is claimed is:

1. A process of manufacturing a corrosion-resistant vacuum metallized article comprising:
   a. preparing a dielectric substrate surface and maintaining the same in a vacuum;
   b. vacuum depositing on said substrate surface a corrosion prone metal;
   c. while continuing said vacuum depositing effecting formation of discrete islands of said metal said islands appearing macroscopically as a continuous film and transmitting therethrough less than 25% of the visible light incident thereon at an angle greater than 60° to the surface thereof but being electrically nonconductive over said surface;
   d. applying a clear resinous protective dielectric top coat as a liquid over and between said discrete islands and wetting said substrate surface with said liquid; and
   e. drying said top coat so applied to a protective film encapsulating said discrete islands and intimately adhering said protective film to said substrate surface.

2. The process of claim 1 wherein said islands under microscopic examination appear rounded in both plan and elevation view and to having been coalesced in liquid phase from small nuclei, said islands having an average diameter of less than 3500° A, wherein said continuous film has a nominal thickness in the range of 150 to 1000° A and wherein said top coat is at least ½ mil. thick (dry basis).

3. The process of claim 1 wherein the substrate giving said substrate surface is an elastomeric thermoplastic urethane; and said top coat is formed from a solvent solution of a plastic selected from the group consisting of acrylics and urethanes.

4. The process of claim 2 wherein said islands have an average diameter of less than 3000° A, and said film has at all times a resistance greater than 100 megaohms.

5. An automobile trim component comprising:
   a. a flexible elastomeric base having a prepared surface;
   b. minute discrete rounded islands consisting of a corrosion prone metal adhered to said surface, said islands appearing visually as a continuous film but being electrically isolated one from another with said film being electrically non-conductive over the surface thereof, while having a light transmission of less than 25% substantially all of said islands having an average diameter of less than 3000°A and a normal film thickness of less than 1000°A; and
   c. a dielectric clear synthetic plastic top coat adhered to said surface and encapsulating and insulating said islands.

6. The trim component of claim 5 wherein said flexible elastomeric base is a urethane and said prepared surface comprises a light-blocking pigmented smooth resinous film.

7. A metallized article comprising:
   a. a substrate having an dielectric surface;
   b. spaced apart electrically discrete minute islands thereon of rounded appearance both in plan and elevation view of a corrosion prone metal having a melting point in the range of 100° to 350° C., said islands having an average diameter of less than 3500°A and the spatial density thereof being sufficient to impart the visual appearance of a specular, continuous metal film, the nominal thickness of said metal film being in the range of 150 to 1,000°A, said film being electrically non-conductive along the plane thereof and having a light transmission of less than 25%;
   c. an intimately adhered dielectric, protective resinous topcoat of a synthetic plastic over said metal film encapsulating and insulating said islands one from another and affixing them to said dielectric surface.

8. The metallized article of claim 7 wherein said topcoat has a thickness of at least ½ mil. (dry basis) and the electric isolation of said islands prevents transfer of corrosion from one island to another upon localized rupture of said topcoat.

9. The metallized article of claim 8 wherein said islands have the appearance when viewed with an electron microscope of having coalesced from smaller nuclei and wherein said metal has a heat of fusion of less than 25 calories per gram and a melting point in the range of 125° to 250° C.

10. A vacuum deposited metal layer on a dielectric substrate, comprised of:
   (a) electrically discrete islands of a corrosion-prone metal with substantial non-conductive open regions completely surrounding each island, said islands and said open regions having a size less than the wave lengths of visible light, said metal layer macroscopically appearing as a continuous metallic film and transmitting therethrough less than 25% of visible light incident thereon; and
   (b) a clear, dielectric resinous protective topcoat thereover (i) having a thickness of at least ½ mil (dry basis), (ii) completely filling said open regions, preventing the intrusion therein of ambient impurities capable of producing an electrochemical corrosion path thereacross, and (iii) being intimately and firmly adhered to said substrate in said open regions and to said islands.

11. The metall layer of claim 10 when said islands have the appearance of having coalesced in molten phase from smaller nuclei.

12. A flexible bright automobile trim component having a non-corroding specular, metal surface of a corrosion prone metal on an extensible plastic substrate comprising:
   (a) a mirror-smooth dielectric extensible plastic substrate;
   (b) a layer thereon of electrically discrete islands of a corrosion-prone metal with substantial non-conductive open regions completely surrounding each island, said islands and said open regions having a size less than the wave lengths of visible light and said layer macroscopically appearing as a continuous metallic film and transmitting therethrough less than 25% of visible light incident thereon, and
   (c) a clear, dielectric resinous protective topcoat thereover (i) having a thickness of at least ½ mil (dry basis), (ii) completely filling said open regions, preventing the intrusion therein of ambient impurities capable of producing an electrochemical corrosion path thereacross, and (iii) being intimately and firmly adhered to said substrate in said open regions and to said islands.

13. A vacuum metallized article having a strongly adhered non-corroding lustrous metal surface of a corrosion prone metal, comprising:
   (a) a smooth dielectric substrate;
   (b) thin film islands of a corrosion prone metal thereon, smaller in diameter than the wavelengths of visible light and having a rounded appearance characteristic of having condensed in liquid phase from small nuclei, each such island being surrounded by an electrically non-conductive open region which is substantial relative to the size of the island but which is smaller in any dimension than the wave lengths of visible light, said thin film islands together defining a bright planar surface that (i) is electrically non-conductive along the plane thereof, (ii) transmits less than 25% the visible light incident thereon, and (iii) as deposited is exceptionally corrosion-prone when directly exposed to a moist environment; and
   (c) a light-passing dielectric resinous topcoat thereover intimately adhered to both said thin film islands and to said dielectric substrate and filling said open region around each island, electrochemically isolating one island from the next.

14. A vacuum metallizing process producing a non-corroding specular surface of a corrosion prone metal, comprising:
   (a) preparing a mirror-smooth dielectric substrate;
   (b) vacuum depositing a corrosion-prone metal on said substrate to form thereby thin film islands of said corrosion prone metal on said substrate that have a size less than the wave lengths of visible light but macroscopically appear as a continuous mettalic film and transmit less than 25% of visible light incident thereon, said islands coalescing in liquid phase from smaller nuclei and having a rounded appearance characteristic of such coalescence;
   (c) arresting the vacuum depositing short of the stage whereat said islands coalesce to an electrically conductive film and while each island is still surrounded by an electrically non-conductive open region which is substantial relative to the size of the island but is smaller in any dimension than the wave lengths of visible light;
   (d) applying a clear dielectric resinous topcoat in liquid phase over said thin film islands and filling said open region about each island; and
   (e) setting said topcoat to a continuous protective film over and between said thin film islands, electrochemically insulating one from another, said topcoat being well adhered to said thin film islands and to said substrate in the areas of said open region about each island.

15. The process of claim 14 wherein said thin film islands have a diameter less than 3000° A, a nominal thickness in the range of 150 to 1000° A; and at all times an electrical resistance along the plane thereof of greater than 100 megahoms and wherein said topcoat is at least ½ mil thick (dry basis).

16. The process of claim 15 wherein said dielectric substrate is a basecoated molded elastomeric plastic and said topcoat is formed from a solvent solution of a resin selected from the group consisting of acrylics and urethane.

* * * * *